United States Patent [19]

LeQueáu

[11] Patent Number: 4,607,236

[45] Date of Patent: Aug. 19, 1986

[54] LINEARIZED PHASE COMPARATOR AND PHASE-LOCKED LOOP COMPRISING SUCH A PHASE COMPARATOR

[75] Inventor: Marcel LeQueáu, Ozoir-La-Ferriere, France

[73] Assignee: U.S. Philips Corporation, New York, N.Y.

[21] Appl. No.: 715,423

[22] Filed: Mar. 25, 1985

[30] Foreign Application Priority Data

Mar. 30, 1984 [FR] France .................. 84 05024

[51] Int. Cl.⁴ .................. H03D 13/00; H03L 7/10
[52] U.S. Cl. .................. 331/17; 331/25; 331/27; 307/516; 328/133
[58] Field of Search .................. 331/17, 25, 27; 307/514, 516, 525, 526, 527, 528; 328/133, 134, 155

[56] References Cited

U.S. PATENT DOCUMENTS

| | | | |
|---|---|---|---|
| 3,997,848 | 12/1976 | Rippy | 329/122 |
| 4,253,189 | 2/1981 | Lemoussu et al. | 331/25 X |
| 4,378,509 | 3/1983 | Hatchett et al. | 307/514 X |
| 4,418,318 | 11/1983 | Swagerty et al. | 331/1 A |

Primary Examiner—Siegfried H. Grimm
Attorney, Agent, or Firm—David R. Treacy

[57] ABSTRACT

A phase comparator for receiving an input signal and a signal to be compared with this input signal, comprising an auxiliary stage. The auxiliary or dynamic reducing stage includes a circuit for reducing a predetermined value of the phase difference between the two inputs of the comparator and a circuit for recovering said value at the output of the comparator via a circuit delaying the information expressing this value. The phase comparator may be used in a phase locked loop.

8 Claims, 3 Drawing Figures

LINEARIZED PHASE COMPARATOR AND PHASE-LOCKED LOOP COMPRISING SUCH A PHASE COMPARATOR

The present invention relates to a linearized phase comparator, and also to a phase-locked loop comprising such a phase comparator.

U.S. Pat. No. 4,378,509 discloses a phase comparator which is assembled more specifically of two logic temporary stores 20 and 21 (latches) each one of which receives one of the two input signals $F_{REF}$ and $F_{VCO}$ of the comparator. The respective outputs of these memories are combined via a logic gate 23 whose output signal is conveyed to the reset-to-zero inputs (reset) of the memories. The linearization of the operating mode of the comparator is obtained by providing a delay circuit 24 between the output of the gate 23 and said reset-to-zero inputs, the delay thus produced in the corresponding signals eliminating the zone in which the comparator operates in the non-linear mode.

A first object of the invention is to provide a phase comparator whose operation is also linearized but using other means.

For this purpose the phase comparator according to the invention comprises an auxiliary stage associated therewith, the auxiliary stage being a so-called dynamic reduction stage formed by means for reducing the phase difference between the two inputs of the comparator by a predetermined value, and also means for recovering said value at the output of the comparator via means for delaying the information expressing this value. Thus, when the value measured by the comparator is lower than the actual phase difference, the result is affected to a lesser degree by the non-linearities of the comparator (for example, for comparators having a sinusoidal characteristic, the distortion is less when the phase-shift to be measured is lower, since the approximation of $\sin\phi$ by $\phi$ is better when $\phi$ is lower).

A further object of the invention is to provide a phase-locked loop comprising a linearized phase comparator. Actually, beyond a predetermined phase difference value, the comparator can no longer measure this difference accurately because of the non-linearities of its transfer function. This results in the performances of the loop being degraded, it may even not be capable of locking itself on the input signal.

The loop according to the invention comprises in a conventional way a phase comparator, a loop filter and an oscillator for measuring the phase difference between an input signal on which said locking action must be established, and the output signal of the oscillator, respectively for conveying to the oscillator said phase difference by filtering it, and for applying to the phase comparator a signal whose frequency is corrected in that said phase difference is reduced. The phase comparator has associated therewith an auxiliary stage, i.e. a dynamic reduction stage formed by means for reducing a predetermined value of the phase difference between the two inputs of the comparator and also means for recovering said value at the output of the comparator via means for delaying the information expressing this value. Thus, the precision of the phase difference measurement effected by the comparator within the loop is improved, since, by the bias of the provisional reduction (by a known quantity) of the quantity to be measured, said measuring operation is effected in the linear region of the characteristic of the comparator.

Particulars and advantages of the invention will now become more apparent from the following detailed description given by way of example with reference to the accompanying drawings, in which.

Figure 1:
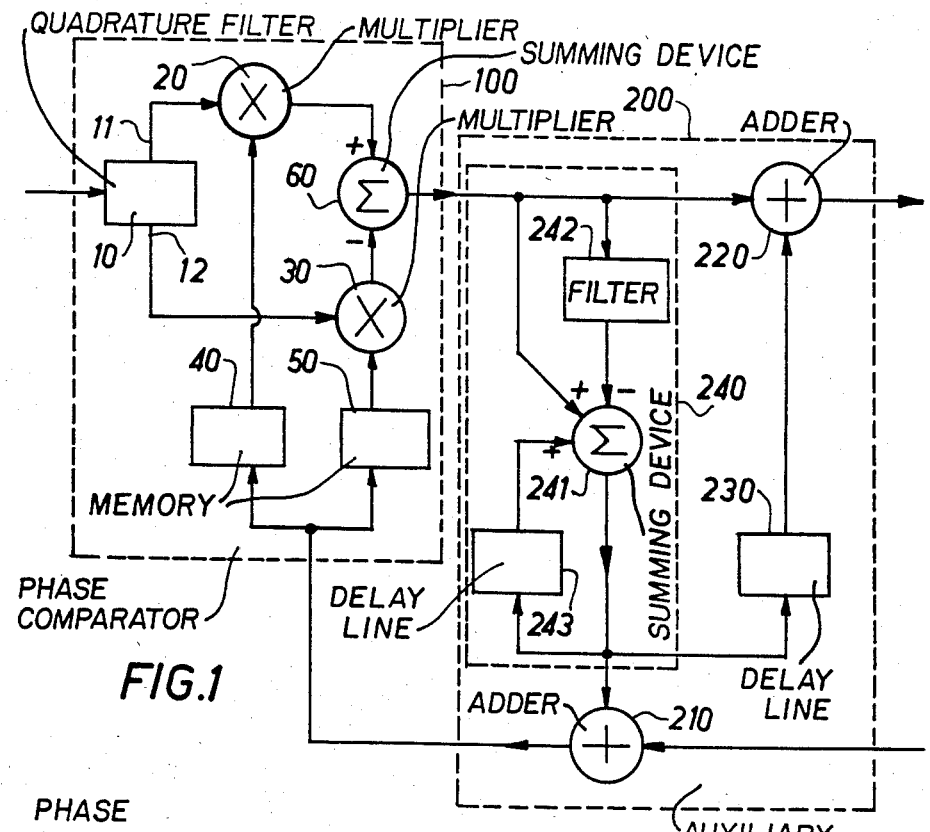
FIG. 1 shows a first embodiment of the invention, in which an auxiliary dynamic reduction stage is associated with a phase comparator.

The phase comparator 100 of which a specific embodiment is shown in FIG. 1, comprises a quadrature filter 10 which receives the input signal and applies this delayed input signal to an output 11 whose phase is designated as $\phi_E$ and applies this same delayed signal but phase-shifted through $\pi/2$ to an output 12 whose phase is $\phi_E + \pi/2$. The outputs 11 and 12 are connected to first inputs of the respective two multipliers 20 and 30, whose second inputs receive the respective outputs from the two read-only memories 40 and 50 which are addressed in common and are controlled directly by the signal with which the phase signal $\phi_E$ will be compared. These memories 40 and 50 convert the phase information $\phi$ present at this common input into the expression $\sin(\phi + \pi/2)$ and the expression $\sin\phi$, respectively. A summing device 60 recieves at its positive input the output of the multiplier 20 and at its negative input the output of the multiplier 30, and produces a signal $\sin\phi_E \cdot \cos\phi - \cos\phi_E \cdot \sin\phi = \sin(\phi_E - \phi)$, that is to say approximately $\phi_E - \phi$ when this difference is small.

An auxiliary stage 200, called the dynamic reduction stage which is formed by an adder 210 receiving input signals $\phi_S$ and $\phi_O$ and transferring the sum $(\phi_S + \phi_O)$ to the comparator 100, and also by an adder 220 receiving the output of the comparator 100 and adding thereto the input signal $\phi_O$ of the adder 210 delayed by a delay line 230, and finally a circuit 240 generating the signal $\phi_O$ which is applied directly to the adder 210 and via the circuit 230 to the adder 220. This circuit 240 comprises a summing device 241 which at a positive input directly receives the output of the comparator 100, at a second negative input this same output signal from the comparator 100 but it has passed through a filter 242, and at a third positive input receives its own output signal $\phi_O$ but delayed by a delay line 243.

This embodiment of the comparator 100 incorporating the auxiliary dynamic reduction stage 200 operates as follows. Added to the input of the comparator 100 which in the absence of the stage 200 would receive the information $\phi_S$ is an information $\phi_O$ which, added to $\phi_S$, will reduce the phase difference measured by the comparator and, as described in the preceeding paragraph, evaluated in the circuit 240 predominantly from the output of said comparator. The phase comparator then produces an information which, instead of being of the type $\sin(\phi_E - \phi_S)$, is of the type $\sin(\phi_E - \phi_S - \phi_O)$. Then, to reestablish the accuracy of the result produced by the comparator 100, it is only necessary to add thereto the information $\phi_O$ which had accordingly artificially reduced the phase difference to be measured.

Figure 2:
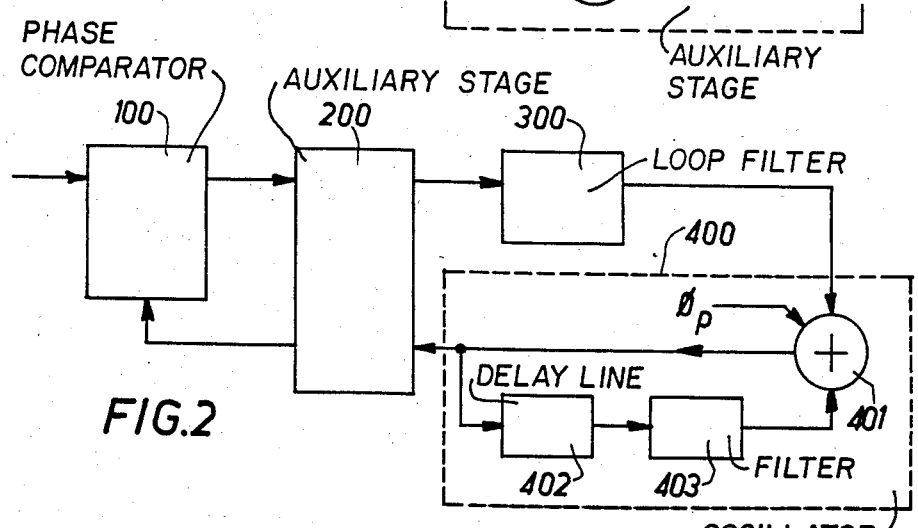
FIG. 2 shows an embodiment of the phase-locked loop comprising such an auxiliary stage.

The comparator thus proposed may more specifically be used in a phase-locked loop, for example of the digital type, such as the loop shown in FIG. 2. This digital loop comprises the comparator 100, the auxiliary stage 200, a loop filter 300 and a digitally controlled oscillator 400. The comparator 100 measures the phase difference between the input signal having a phase $\phi_E$ on which the loop must be locked, and the signal having a phase of $(\phi_S+\phi_O)$ applied to its other input. The loop filter 300 conveys to the oscillator 400 the phase difference obtained at the output of the comparator 100, corrected by the action of stage 200. The signal thus conveyed to the oscillator 400 modifies the frequency thereof in such a way that the phase difference is reduced, which procedure ensures that the loop is locked on the signal of the phase $\phi_E$.

The comparator 100 and the stage 200 comprise the same components as discussed above. The loop filter 300 is band-pass filter. The oscillator 400 is of the accumulator type and comprises an adder 401, which at a first input receives its own output signal after this signal has been passed through a delay line 402 and a filter 403 identical to the loop filter 300, at a second input the output of the loop filter 300, and at a third input an accumulation constant $\phi_P$ which represents the phase incrementation. The delays caused by the delay lines 243 and 402 are equal to an integral number of sampling periods, generally one period.

A phase-locked loop having this structure has stability, precision, speed and frequency band characteristics which are better than those obtained with the same loop but without the auxiliary stage 200. In the described case of a loop whose phase comparator comprises two multipliers, linearizing the operation of the comparator enables this loop to operate substantially in the overall Nyquist band (with the exception of the zero frequency, the semi-sampling frequency and frequencies near these two frequencies). In addition, such a loop, utilized in a frequency demodulator, has an extended threshold which is often higher than that obtained with analog phase-locked loops; actually, whereas in the analog mode the minimum value of the loop gain is limited by long-term derivatives of the components, this gain would assume for a digital loop the optimum value 1 (that is to say that, the loop being open, a continuous phase shift $\Delta\phi$ at its input causes a continuous phase shift $-\Delta\phi$ at the output of the oscillator).

Obviously, the present invention is not limited to the described and illustrated embodiments on the basis of which several variations can be proposed without departing from the scope of the invention. It will more particularly be noted that in the case in which a digital filter is described, the loop filter is a digital filter and that this filter, i.e. the whole loop, can, if the sampling frequency is not too high, be replaced by a microprocessor performing the same functions. It will also be noted that the value of the phase difference obtained at the output of the comparator 100 is minimal when the transfer function of the auxiliary filter 242 is equal to that of the loop, the loop being in the closed state, and that the delay caused by the delay line 230 is limited to one sampling period. However, since in practice the obtaining of a minimal value is not necessarily the aim, the object only being to maintain the measurement effected by the comparator within a given dynamic range, this transfer function of the filter 242 can only be an approximation of the above-mentioned transfer function, and the delay caused by the line 230 may be longer than one period.

Figure 3:
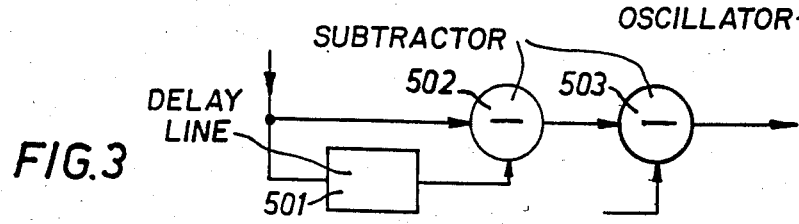
FIG. 3 shows, for the case in which the loop according to the invention is part of a frequency demodulator for a television receiver in accordance with the SECAM Standard, the filter required to ultimately obtain the reduced colour difference signal.

On the other hand, for the case of a colour-information demodulator in a television receiver of the SECAM type, a preferred choice for the loop filter 300, the filter 242 and the filter 403 is a transfer function identical and equal to the transfer function of the reducing filter defined in the SECAM coding system, but these transfer functions of the filter 403 can each be only an approximation of the desired transfer functions. Anyway, the reduced colour difference is obtained after a filter shown in FIG. 3, provided at the output of the oscillator 400 and formed by a delay line 501 and two subtractors 502 and 503, have been passed through: the output of the first subtractor 502 gives the phase difference between two, generally consecutive, samples of the oscillator output signal, while the second subtractor 503 subtracts from this difference the accumulation constant $\phi_P$ which here represents the phase increment of the chrominance subcarrier between two consecutive samples, and thus produces a signal which is proportional to the colour difference signal. It will be obvious that these last remarks also apply for the case of a multi-standard receiver, or even a receiver utilizing the standard C-MAC packets.

What is claimed is:

1. In a phase comparator system having first and second inputs for receiving first and second input signals to be compared, and a first output, the system comprising a phase comparator with third and fourth inputs and a second output, means coupling said third and fourth inputs to said first and second inputs respectively and means coupling said second output to said first output; the improvement comprising a dynamic reduction stage comprised of means coupled between said second and fourth inputs for reducing the phase difference between said signals applied to said third and fourth inputs by a determined value, and delay means coupled between said first and second outputs for increasing the output signal at said second output by an amount dependent upon said determined value.

2. The phase comparator system of claim 1 wherein said dynamic reduction stage further comprises means coupled to said second output for deriving a value signal corresponding to said determined value, said means coupled between said second and fourth inputs comprises a first adder connected to add said value signal to signals applied to said fourth input, and said delay means comprises a delay circuit connected to receive said value signal, and a second adder connected to add the output of said delay circuit to signals applied to said first output.

3. The phase comparator system of claim 1 wherein said dynamic reduction stage comprises a summing device having a first positive input coupled to said second output, a second negative input coupled to said second output by way of a filter, and a third positive input coupled to the output of said summing device by way of a delay line, said means for reducing phase difference comprising adding means for adding the output of said summing means to signals applied to said fourth input, said means for increasing the output signal comprising delay means for receiving the output of said summing device, and adding means for adding the output of said delay means to signals applied to said first output.

4. In a phase-locked loop comprising a phase comparator system, a loop filter and an oscillator, means connecting said phase comparator for measuring the phase difference between an input signal and the output signal of the oscillator, said loop filter comprising filtering means connected to convey a signal corresponding to said difference from said comparator to said oscillator;

the improvement wherein said phase comparator comprises a phase comparator having a first input for receiving said input signal, a second input and a first output, and a dynamic reduction stage comprising means coupled between said oscillator and second input for reducing the phase difference between signals applied to the inputs of said phase comparator by a determined value, and delay means coupled between said loop filter and said first output for increasing the output signal at said first output by an amount dependent upon said determined value.

5. The phase-locked loop of claim 4 wherein said dynamic reduction stage further comprises means coupled to said second output for deriving a value signal corresponding to said determined value, said means coupled between said second input and oscillator comprises a first adder connected to add said value signal to signals applied to said second input, and said delay means comprises a delay circuit connected to receive said value signal, and a second adder connected to add the output of said delay circuit to signals applied to said first output.

6. The phase-locked loop of claim 4 wherein said dynamic reduction stage comprises a summing device having a first positive input coupled to the output of said comparator, a second negative input coupled to the output of said comparator by way of a filter, and a third positive input coupled to the output of said summing device by way of a delay line, said means for reducing phase difference comprising adding means for adding the output of said summing means to signals applied to said second input, said means for increasing the output signal comprising delay means for receiving the output of said summing device, and adding means for adding the output of said delay means to signals applied to the output of said comparator.

7. The phase-locked loop of claim 6 wherein the loop is a closed digital loop and the transfer function of said filter is substantially equal to the transfer function of said loop.

8. The phase-locked loop of claim 7, wherein said loop filter comprises a microprocessor.

* * * * *